(12) United States Patent
Ren et al.

(10) Patent No.: US 12,414,267 B2
(45) Date of Patent: Sep. 9, 2025

(54) FLUORINATED AROMATICS AND METHODS OF USING SAME

(71) Applicant: 3M INNOVATIVE PROPERTIES COMPANY, St. Paul, MN (US)

(72) Inventors: Hui Ren, Woodbury, MN (US); Daniel J. Harrison, St. Paul, MN (US); Eileen G. Burke, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 805 days.

(21) Appl. No.: 17/617,633

(22) PCT Filed: Jun. 8, 2020

(86) PCT No.: PCT/IB2020/055360
§ 371 (c)(1),
(2) Date: Dec. 9, 2021

(87) PCT Pub. No.: WO2020/250104
PCT Pub. Date: Dec. 17, 2020

(65) Prior Publication Data
US 2022/0256729 A1    Aug. 11, 2022

Related U.S. Application Data

(60) Provisional application No. 62/860,278, filed on Jun. 12, 2019.

(51) Int. Cl.
| H05K 7/20 | (2006.01) |
| C09K 5/10 | (2006.01) |
| H01B 3/24 | (2006.01) |
| H01M 10/613 | (2014.01) |

(52) U.S. Cl.
CPC ............ *H05K 7/203* (2013.01); *C09K 5/10* (2013.01); *H01B 3/24* (2013.01); *H01M 10/613* (2015.04)

(58) Field of Classification Search
CPC ............ H05K 7/203; C09K 5/10; H01B 3/24; H01M 10/613; Y02E 60/10
See application file for complete search history.

(56) References Cited

U.S. PATENT DOCUMENTS

| 3,975,448 A | 8/1976 | Delaunois | |
| 4,743,300 A * | 5/1988 | Brinduse | C08G 65/332 106/38.22 |
| 2007/0267464 A1 | 11/2007 | Vitcak | |
| 2009/0008596 A1 | 1/2009 | Petricci | |
| 2015/0380782 A1 | 12/2015 | Youngs | |
| 2017/0032355 A1 | 2/2017 | Fujita | |

FOREIGN PATENT DOCUMENTS

| GB | 461681 | 2/1937 |
| GB | 1076357 | 7/1967 |
| GB | 1133492 | 11/1968 |
| GB | 1413764 | 11/1975 |
| WO | 2020127771 | 5/2020 |
| WO | 2020127665 | 6/2020 |

OTHER PUBLICATIONS

Chambers, "Reactions Involving Fluoride Ion. Part I. The Polyfluoroalkylation of Fluorinated Aromatic Systems", Journal of the Chemical Society C: Organic, 1968, pp. 2221-2227.
Furin, "Synthesis of Partially Fluorinated Organic Compounds from Perfluoro-2-methyl-2-pentene and Phenol Derivatives", Mar. 2005, vol. 75, No. 3, pp. 394-401.
International Search Report for PCT International Application No. PCT/IB2020/055360, mailed on Jul. 27, 2020, 5 pages.
Ishikawa, "The Reactions of the Dimers of Hexafluoropropene with O-Nucleophiles", 1976, vol. 49, No. 2, pp. 502-505.
Makarov, "Hexafluoropropene Trimer. Synthesis And Properties of Functional Derivatives", Journal of Fluorine Chemistry, Oct. 1977, vol. 10, No. 4, pp. 323-327.
Makarov, "Reactions of Hexafluoropropene Trimers With Thiols", Journal of Fluorine Chemistry, 1990, Vo. 48, pp. 133-143.
Maruta, "Mode of the Nucleophilic Reaction of F-2,4-Dimethyl-3-Heptene and Phenol", Journal of Fluorine Chemistry, 1979, vol. 13, pp. 421-429.
Snegirev, "Reaction of Perfluoro-2-Methylpent-2-Ene With Oxygen Nucleophiles", Russian Chemical Bulletin, 1986, vol. 35, pp. 91-103.
Timperley "Fluoroalkene chemistry: Part 3. Reactions of arylthiols with perfluoroisobutene, perfluoropropene and chlorotrifluoroethene" Journal of Fluorine Chemistry, Feb. 2006, vol. 127, No. 2, pp. 249-256.

\* cited by examiner

*Primary Examiner* — Andrew J. Oyer
(74) *Attorney, Agent, or Firm* — Jeffrey M. Olofson

(57) ABSTRACT

An apparatus for heat transfer includes a device and a mechanism for transferring heat to or from the device. The mechanism includes a working fluid that includes a fluorinated aromatic compound having structural formula (I): where Q is a carbon atom or a nitrogen atom; G is an oxygen atom or a sulfur atom; each $R^1$ is, independently, a fluoroalkenyl group having 2 to 11 carbon atoms and optionally comprises one or more catenated heteroatoms; each $R^2$ is, independently, (i) a hydrogen atom or a fluorine atom; or (ii) a fluoroalkyl group or a fluoroalkenyl group having 1 to 9 carbon atoms and optionally comprises one or more catenated heteroatoms; each $R^3$ is, independently, a hydrogen atom or a fluorine atom; x is 1-3; a is 1-2; y is 1-5; when Q is a carbon atom, z=6-y-a; and when Q is a nitrogen atom, z=5-y-a.

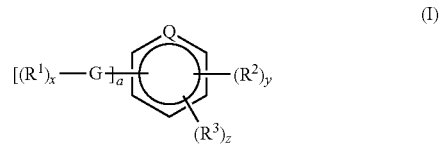

(I)

13 Claims, No Drawings

FLUORINATED AROMATICS AND METHODS OF USING SAME

CROSS REFERENCE TO RELATED APPLICATIONS

This application is a national stage filing under 35 U.S.C. 371 of PCT/IB2020/055360, filed Jun. 8, 2020, which claims the benefit of U.S. Provisional Application No. 62/860,278, filed Jun. 12, 2019, the disclosure of which is incorporated by reference in its/their entirety herein.

FIELD

The present disclosure relates to fluorinated aromatics and methods of making and using the same, and to working fluids that include the same.

BACKGROUND

Various fluorinated aromatic compounds are described in, for example, "The Reactions of the Dimers of Hexafluoropropene with O-Nucleophiles", Nobuo, I.; Nagashima, A. *Bulletin of the Chemical Society of Japan* 1976, 49, 502-505; "Mode of the nucleophilic reaction of F-2,4-dimethyl-3-heptene and phenol", Maruta, M.; Ishikawa, N. *Journal of Fluorine Chemistry* 1979, 13, 421-429; and "Synthesis of partially fluorinated organic compounds from perfluoro-2-methyl-2-pentene and phenol derivatives", Furin, G. G.; Zhuzhgov, E. L.; Chi, K.-V., Kim, N.-A. *Russian Journal of General Chemistry* 2005, 75, 394-401.

SUMMARY

In some embodiments, an apparatus for heat transfer is provided. The apparatus includes a device and a mechanism for transferring heat to or from the device. The mechanism includes a working fluid that includes a fluorinated aromatic compound having structural formula (I):

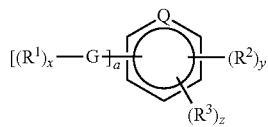

(I)

where Q is a carbon atom or a nitrogen atom;
G is an oxygen atom or a sulfur atom;
each $R^1$ is, independently, a fluoroalkenyl group having 2 to 11 carbon atoms and optionally comprises one or more catenated heteroatoms;
each $R^2$ is, independently, (i) a hydrogen atom or a fluorine atom; or (ii) a fluoroalkyl group or a fluoroalkenyl group having 1 to 9 carbon atoms and optionally comprises one or more catenated heteroatoms;
each $R^3$ is, independently, a hydrogen atom or a fluorine atom;
x is 1-3;
a is 1-2;
y is 1-5;
when Q is a carbon atom, z=6-y-a; and
when Q is a nitrogen atom, z=5-y-a.

The above summary of the present disclosure is not intended to describe each embodiment of the present disclosure. The details of one or more embodiments of the disclosure are also set forth in the description below. Other features, objects, and advantages of the disclosure will be apparent from the description and from the claims.

DETAILED DESCRIPTION

In view of an increasing demand for environmentally friendly chemical compounds, it is recognized that there exists an ongoing need for new working fluids that provide reductions in environmental impact while still meeting the performance requirements (e.g., nonflammability, solvency, stability, and operating temperature range) of a variety of different applications (e.g., heat transfer, immersion cooling, foam blowing agents, solvent cleaning, and deposition coating solvents), and be manufactured cost-effectively.

Generally, the present disclosure relates to fluorinated aromatic compounds (including, for example, aromatic fluoroalkenyl ethers, as well as benzene derivatives bearing fluoroalkyl group(s)) that exhibit significantly shorter atmospheric lifetimes and lower global warming potentials than competitive products with comparable operating temperature ranges (e.g., perfluoropolyethers (PPFEs)). In light of the increasing concerns over climate change, and the probable escalation in the regulation of atmospheric pollutants, it is recognized that less environmentally persistent materials are needed for the applications described herein. Further, the compositions disclosed here have higher boiling points than certain commercial working fluids (e.g., hydrofluoroethers (HFEs)) of comparable molecular weight, while retaining the desirable properties of the commercial fluids, such as low toxicity, and wide temperature ranges where the materials exist in the liquid phase. In some embodiments, the fluorinated aromatic compounds of the present disclosure may also include lower dielectric constants than certain commercial working fluids.

There is a need for non-flammable, high-boiling working fluids for high temperature applications (such as those discussed below) which additionally possess wide liquid ranges (e.g., <-50 to >140° C. at 760 Torr), low dielectric constants (e.g., ≤6 at 1 kHz), and low global warming potentials (GWPs) (e.g., <100).

Certain fluorocarbon-based products (e.g., perfluoropolyethers (PPFEs)) currently present in the high-boiling market segment meet some of these requirements but are generally associated with high GWPs (≥3000 for PFPEs), highlighting a need for less environmentally persistent alternative products. Similarly, certain hydrocarbon-based products (e.g., fluids based on alkanes and/or hydrocarbon aromatics) have desirable dielectric properties, wide liquid ranges and low GWPs, but these compositions are flammable (as defined below), with flash points generally <100° C. for fluids with boiling points comparable to the boiling points of the compounds of the present disclosure. Flammability poses significant safety concerns and limits the applications of such fluids.

In addition to the high boiling points and favorable dielectric properties, the fluorinated aromatics of the present disclosure have significantly shorter atmospheric lifetimes and lower GWPs than known working fluids with similar physical properties including, for example, perfluorocarbons (PFCs), perfluoropolyethers (PFPEs), hydrofluoroethers (HFEs), and hydrofluorocarbons (HFCs). The materials are also generally non-flammable and have zero ozone depletion potential (ODP).

As used herein, "catenated heteroatom" means an atom other than carbon (for example, oxygen, nitrogen, or sulfur) that is bonded to at least two carbon atoms in a carbon chain (linear or branched or within a ring) so as to form a carbon-heteroatom-carbon linkage.

As used herein, "fluoro-" (for example, in reference to a group or moiety, such as in the case of "fluoroalkene" or "fluoroalkenyl" or "fluoroalkane" or "fluoroalkyl" or "fluorocarbon") or "fluorinated" means (i) partially fluorinated such that there is at least one carbon-bonded hydrogen atom, or (ii) perfluorinated.

As used herein, "perfluoro-" (for example, in reference to a group or moiety, such as in the case of "fluoroalkene" or "fluoroalkenyl" or "fluoroalkane" or "fluoroalkyl" or "fluorocarbon") or "perfluorinated" means completely fluorinated such that, except as may be otherwise indicated, there are no carbon-bonded hydrogen atoms replaceable with fluorine.

As used herein, "alkyl" means a molecular fragment comprised of a valence-saturated carbon-based skeleton (i.e., derived from an alkane), which may be linear, branched or cyclic.

As used herein, "alkenyl" means a molecular fragment comprised of a carbon-base skeleton, which contains at least one carbon-carbon double bond (i.e., derived from alkene, diene, etc.); alkenyl fragments may be linear, branched or cyclic.

As used herein, "fluorinated aromatic" or "fluorinated aromatic compound" refers to a compound having an aromatic moiety (e.g., benzene and pyridine derivatives), which also contains carbon-fluorine bonds. The aromatic ring may be directly fluorinated (i.e., with aryl carbon-fluorine bonds; e.g., pentafluorophenol derivatives), with group(s) attached to the aromatic ring that also contain carbon-fluorine bond(s) (e.g., fluoroalkyl, fluoroalkenyl, and derivatives thereof containing catenated heteroatom(s)). Alternatively, the aromatic ring may be non-fluorinated (i.e., without aryl carbon-fluorine bonds; e.g., phenol derivatives), with group(s) attached to the aromatic ring that contain carbon-fluorine bond(s) (e.g., fluoroalkyl, fluoroalkenyl, and derivatives thereof containing catenated heteroatom(s)).

As used herein, the singular forms "a", "an", and "the" include plural referents unless the content clearly dictates otherwise. As used in this specification and the appended embodiments, the term "or" is generally employed in its sense including "and/or" unless the content clearly dictates otherwise.

As used herein, the recitation of numerical ranges by endpoints includes all numbers subsumed within that range (e.g., 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should be construed in light of the number of reported significant digits and by applying ordinary rounding techniques.

In some embodiments, the present disclosure is directed to fluorinated aromatic compounds represented by the following structural formula (I):

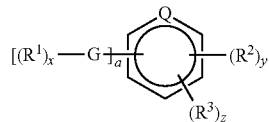

(I)

where Q is a carbon atom or a nitrogen atom;
G is an oxygen atom or a sulfur atom;
each $R^1$ is, independently, a fluoroalkenyl group having 2 to 11, 3 to 9, 4 to 8, or 4 to 7 carbon atoms and optionally comprises one or more catenated heteroatoms;
each $R^2$ is, independently, (i) a hydrogen atom or a fluorine atom; or (ii) a fluoroalkyl group or a fluoroalkenyl group having 1 to 9, 1 to 6, or 1 to 4 carbon atoms and optionally comprises one or more catenated heteroatoms;
$R^3$ is a hydrogen atom or a fluorine atom;
x is 1-3;
a is 1-2 or 1;
y is 1-5;
when Q is a carbon atom, z=6-y-a; and
when Q is a nitrogen atom, z=5-y-a.

In some embodiments, either or both of $R^1$ and $R^2$ (when $R^2$ is a fluoroalkyl or a fluoroalkenyl group) may be perfluorinated.

In some embodiments, the fluorine content in the fluorinated aromatic compounds of the present disclosure may be sufficient to make the compounds non-flammable according to ASTM D-3278-96 e-1 test method ("Flash Point of Liquids by Small Scale Closed Cup Apparatus").

In various embodiments, representative examples of the compounds of general formula (I) include the following:

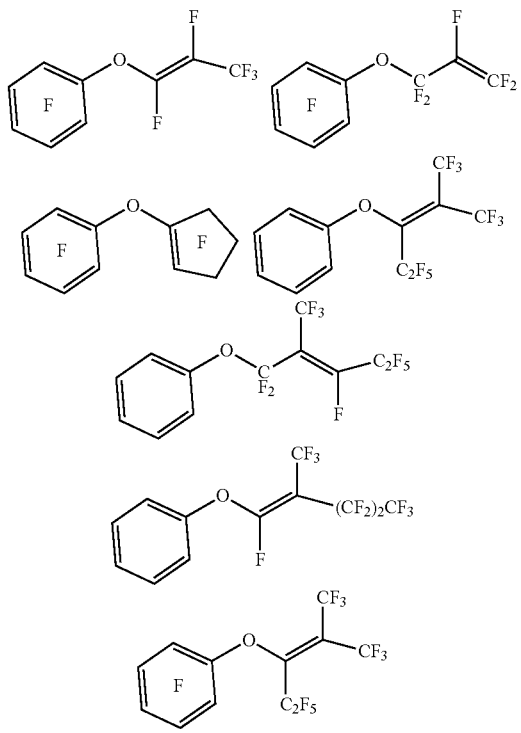

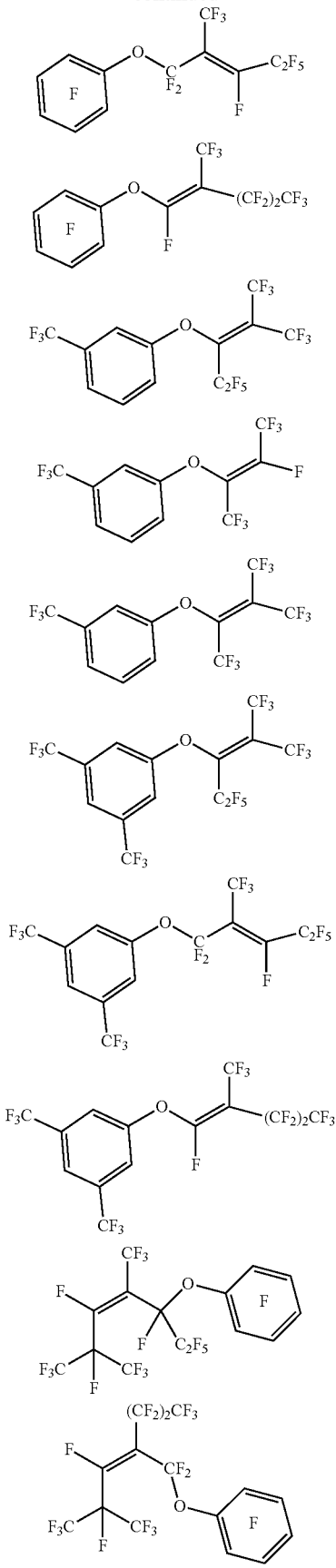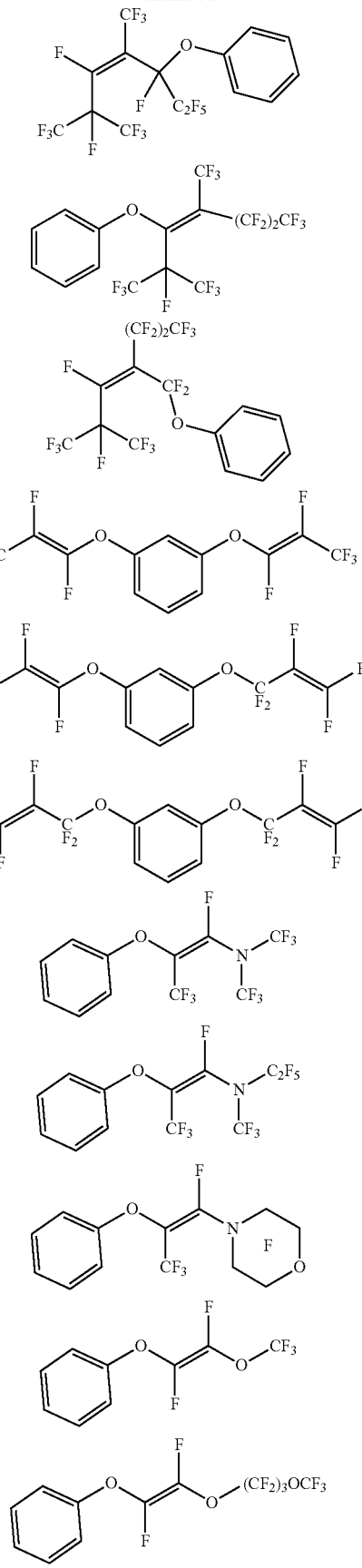

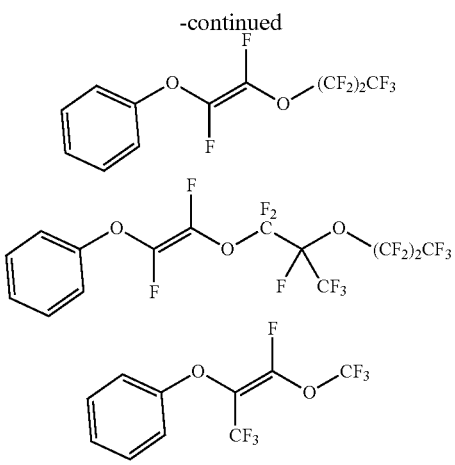

For purposes of the present disclosure, it is to be appreciated that any of the fluorinated aromatic compounds may include the E isomer, the Z isomer, or a mixture of the E and Z isomers, irrespective of what is depicted in any of the general formulas or chemical structures.

In some embodiments, the fluorinated aromatics of the present disclosure may be useful over a broad operating temperature range. In this regard, in some embodiments, the fluorinated aromatics of the present disclosure may have a boiling point of no lower than 30, 40, 50, 60, 70, 80, or 90 degrees Celsius and no higher than 290, 270, 250, 230, 210, 190, 170, 150, 130, 120, 110, 100, 90, or 80 degrees Celsius.

In some embodiments, the fluorinated aromatics of the present disclosure may be hydrophobic, relatively chemically unreactive, and thermally stable. The fluorinated aromatics compounds may have a low environmental impact. In this regard, the fluorinated aromatics compounds of the present disclosure may have a global warming potential (GWP) of less than 500, 300, 200, 100, 50, 10, or less than 1. As used herein, GWP is a relative measure of the global warming potential of a compound based on the structure of the compound. The GWP of a compound, as defined by the Intergovernmental Panel on Climate Change (IPCC) in 1990 and updated in 2007, is calculated as the warming due to the release of 1 kilogram of a compound relative to the warming due to the release of 1 kilogram of $CO_2$ over a specified integration time horizon (ITH).

$$GWP_i(t') = \frac{\int_0^{ITH} a_i [C(t)] dt}{\int_0^{ITH} a_{CO_2} [C_{CO_2}(t)] dt} = \frac{\int_0^{ITH} a_i C_{0i} e^{-t/\tau} dt}{\int_0^{ITH} a_{CO_2} [C_{CO_2}(t)] dt}$$

In this equation $a_i$ is the radiative forcing per unit mass increase of a compound in the atmosphere (the change in the flux of radiation through the atmosphere due to the IR absorbance of that compound), C is the atmospheric concentration of a compound, $\tau$ is the atmospheric lifetime of a compound, t is time, and i is the compound of interest. The commonly accepted ITH is 100 years representing a compromise between short-term effects (20 years) and longer-term effects (500 years or longer). The concentration of an organic compound, i, in the atmosphere is assumed to follow pseudo first order kinetics (i.e., exponential decay). The concentration of $CO_2$ over that same time interval incorporates a more complex model for the exchange and removal of $CO_2$ from the atmosphere (the Bern carbon cycle model).

In some embodiments, the fluorinated aromatics of the present disclosure can be prepared by nucleophilic displacement of a fluoride ion from a fluoroalkene by a phenolate ion or a thiophenolate ion. The phenolate or thiophenolate species may be a pre-formed alkali metal salt (e.g., sodium or potassium phenolate or thiophenolate). Alternatively, phenolate or thiophenolate species may be formed in the reaction medium from the parent phenol or thiophenol in the presence of a Brønsted base; suitable bases include amines (e.g., triethylamine), alkali metal carbonates (e.g., sodium or potassium carbonate) or alkali metal hydroxides (e.g., sodium or potassium hydroxide).

In some embodiments, the fluorinated aromatics can be prepared by formal displacement of one or more fluoride ions directly bound to an aromatic ring by a fluoroalkyl anion generated in situ through the interaction of a metal fluoride (e.g., potassium or cesium fluoride) with a fluoroalkene (i.e., nucleophilic aromatic substitution).

In some embodiments, the present disclosure is further directed to working fluids that include one or more of the above-described fluorinated aromatic compounds as a major component. For example, the working fluids may include at least 25%, at least 50%, at least 70%, at least 80%, at least 90%, at least 95%, or at least 99% by weight of the above-described fluorinated aromatic compounds, based on the total weight of the working fluid. In addition to the fluorinated aromatic compounds, the working fluids may include a total of up to 75%, up to 50%, up to 30%, up to 20%, up to 10%, or up to 5% by weight of one or more of the following components: alcohols, ethers, alkanes, alkenes, haloalkenes, perfluorocarbons, perfluorinated tertiary amines, perfluoroethers, cycloalkanes, esters, ketones, oxiranes, aromatics, siloxanes, hydrochlorocarbons, hydrochlorofluorocarbons, hydrofluorocarbons, hydrochloroolefins, hydrochlorofluoroolefins, hydrofluoroethers, sulfones, or mixtures thereof, based on the total weight of the working fluid. Such additional components can be chosen to modify or enhance the properties of a composition for a particular use.

In some embodiments, the fluorinated aromatics of the present disclosure (or working heat transfer fluids containing the same) can be used in various applications as heat transfer agents (for example, for the cooling or heating of integrated circuit tools in the semiconductor industry, including tools such as dry etchers, integrated circuit testers, photolithography exposure tools (steppers), ashers, chemical vapor deposition equipment, automated test equipment (probers), physical vapor deposition equipment (e.g. sputterers), and vapor phase soldering fluids, and thermal shock fluids).

In some embodiments, the present disclosure is further directed to an apparatus for heat transfer that includes a device and a mechanism for transferring heat to or from the device. The mechanism for transferring heat may include a heat transfer or working fluid that includes one or more fluorinated aromatics of the present disclosure.

The provided apparatus for heat transfer may include a device. The device may be a component, work-piece, assembly, etc. to be cooled, heated or maintained at a predetermined temperature or temperature range. Such devices include electrical components, mechanical components and optical components. Examples of devices of the present disclosure include, but are not limited to microprocessors, wafers used to manufacture semiconductor devices, power control semiconductors, electrical distribution switch gear, power transformers, circuit boards, multi-chip modules, packaged and unpackaged semiconductor devices, lasers, chemical reactors, fuel cells, heat exchangers, and electrochemical cells. In some embodiments, the device can include a chiller, a heater, or a combination thereof.

In yet other embodiments, the devices can include electronic devices, such as processors, including microprocessors. As these electronic devices become more powerful, the amount of heat generated per unit time increases. Therefore, the mechanism of heat transfer plays an important role in processor performance. The heat-transfer fluid typically has good heat transfer performance, good electrical compatibility (even if used in "indirect contact" applications such as those employing cold plates), as well as low toxicity, low (or non-) flammability and low environmental impact. Good electrical compatibility requires that the heat-transfer fluid candidate exhibit high dielectric strength, high volume resistivity, and poor solvency for polar materials. Additionally, the heat-transfer fluid should exhibit good mechanical compatibility, that is, it should not affect typical materials of construction in an adverse manner, and it should have a low pour point and low viscosity to maintain fluidity during low temperature operation.

The provided apparatus may include a mechanism for transferring heat. The mechanism may include a heat transfer fluid. The heat transfer fluid may include one or more fluorinated aromatics of the present disclosure. Heat may be transferred by placing the heat transfer mechanism in thermal contact with the device. The heat transfer mechanism, when placed in thermal contact with the device, removes heat from the device or provides heat to the device, or maintains the device at a selected temperature or temperature range. The direction of heat flow (from device or to device) is determined by the relative temperature difference between the device and the heat transfer mechanism.

The heat transfer mechanism may include facilities for managing the heat-transfer fluid, including, but not limited to pumps, valves, fluid containment systems, pressure control systems, condensers, heat exchangers, heat sources, heat sinks, refrigeration systems, active temperature control systems, and passive temperature control systems. Examples of suitable heat transfer mechanisms include, but are not limited to, temperature-controlled wafer chucks in plasma enhanced chemical vapor deposition (PECVD) tools, temperature-controlled test heads for die performance testing, temperature-controlled work zones within semiconductor process equipment, thermal shock test bath liquid reservoirs, and constant temperature baths. In some systems, such as etchers, ashers, PECVD chambers, vapor phase soldering devices, and thermal shock testers, the upper desired operating temperature may be as high as 170° C., as high as 200° C., or even as high as 230° C.

Heat can be transferred by placing the heat transfer mechanism in thermal communication with the device. The heat transfer mechanism, when placed in thermal communication with the device, removes heat from the device or provides heat to the device, or maintains the device at a selected temperature or temperature range. The direction of heat flow (from device or to device) is determined by the relative temperature difference between the device and the heat transfer mechanism. The provided apparatus can also include refrigeration systems, cooling systems, testing equipment and machining equipment. In some embodiments, the provided apparatus can be a constant temperature bath or a thermal shock test bath.

In some embodiments, the present disclosure is directed to a thermal management system for an electrochemical cell pack (e.g., lithium-ion battery pack). The system may include an electrochemical cell pack and a working fluid in thermal communication with the battery pack. The working fluid may include one or more fluorinated aromatics of the present disclosure.

Electrochemical cells (e.g., lithium-ion batteries) are in widespread use worldwide in a vast array of electronic and electric devices ranging from hybrid and electric vehicles to power tools, portable computers, and mobile devices. While generally safe and reliable energy storage devices, lithium-ion batteries are subject to catastrophic failure known as thermal runaway under certain conditions. Thermal runaway is a series of internal exothermic reactions that are triggered by heat. The creation of excessive heat can be from electrical over-charge, thermal over-heat, or from an internal electrical short. Internal shorts are typically caused by manufacturing defects or impurities, dendritic lithium formation and mechanical damage. While there is typically protective circuitry in the charging devices and in the battery packs that will disable the battery in the event of overcharging or overheating, it cannot protect the battery from internal shorts caused by internal defects or mechanical damage.

A thermal management system for lithium-ion battery packs is often required to maximize the cycle life of lithium-ion batteries. This type of system maintains uniform temperatures of each cell within a battery pack. High temperatures can increase the capacity fade rate and impedance of lithium-ion batteries while decreasing their lifespan. Ideally, each individual cell within a battery pack will be at the same ambient temperature.

Direct contact fluid immersion of batteries can mitigate low probability, but catastrophic, thermal runaway events while also providing necessary ongoing thermal management for the efficient normal operation of the lithium-ion battery packs. This type of application provides thermal management when the fluid is used with a heat exchange system to maintain a desirable operational temperature range. However, in the event of mechanical damage or an internal short of any of the lithium-ion cells, the fluid would also prevent propagation or cascading of the thermal runaway event to adjacent cells in the pack via evaporative cooling, thus significantly mitigating the risk of a catastrophic thermal runaway event involving multiple cells. As with immersion cooling of electronics described above, immersion cooling and thermal management of batteries can be achieved using a system designed for single phase or two-phase immersion cooling and the fluid requirements for battery cooling are similar to those described above for electronics. In either scenario, the fluids are disposed in thermal communication with the batteries to maintain, increase, or decrease the temperature of the batteries (i.e., heat may be transferred to or from the batteries via the fluid).

Direct contact fluid immersion technology has been shown to be useful for thermal management of batteries and for providing thermal runaway protection, but there is still a need for improved fluids that can provide better chemical stability and system longevity. Hydrofluoroethers and perfluoroketones are two examples of chemistries that have shown utility in direct contact fluid immersion heat transfer applications for thermal management and thermal runaway protection of batteries, while also providing acceptable global warming potentials. These applications place stringent performance requirements on the fluids employed, such as non-flammability, acceptable toxicity, small environmental footprint, high dielectric strength, low dielectric constant, high volume resistivity, stability, materials compatibility, and good thermal properties to maintain high volume resistivity over long periods. In some embodiments, the present disclosure is directed to a direct contact fluid immersion thermal management system for an electrochemical cell pack. The system may include an electrochemical cell pack and a working fluid in thermal communication with the pack. The working fluid may include one or more of the fluorinated aromatics of the present disclosure.

In some embodiment, the present disclosure describes is directed to use of one or more of the fluorinated aromatics (or fluorinated aromatic containing working fluids) as single-phase immersion cooling fluids for electronic devices (e.g., computer server). There is no phase change in single phase immersion. Instead the fluid warms and cools as it flows or is pumped through the electronic device and a heat exchanger, respectively, thereby transferring heat away from the electronic device.

In some embodiments, the present disclosure may be directed to an immersion cooling system which operates by single-phase immersion cooling. Generally, the single phase immersion cooling system may include a heat generating component disposed within the interior space of a housing such that it is at least partially immersed (and up to fully immersed) in the liquid phase of a working fluid. The single-phase system may further include a pump and a heat exchanger, the pump operating to move the working fluid to and from the heat generating electronic devices and the heat exchanger, and the heat exchanger operating to cool the working fluid. The heat exchanger may be disposed within or external to the housing.

EXAMPLES

Objects and advantages of this disclosure are further illustrated by the following illustrative and comparative examples. Unless otherwise noted, all parts, percentages, ratios, etc. in the examples and the rest of the specification are by weight, and all reagents used in the examples were obtained or are available from general chemical suppliers such as, for example, Sigma-Aldrich Corp., Saint Louis, MO, US, and Fisher Scientific, Waltham, MA, US, or they may be synthesized by conventional methods. The following abbreviations are used herein: M=molarity=moles/liter; mL=milliliters, L=liters, mmol=millimoles, g/mol=grams per mole, min=minutes, h=hours, yr=years, g=grams, kg=kilograms, g/mL=grams per milliliter, ° C.=degrees Celsius, bp=boiling point, Hz=Hertz, kHz=kilohertz, MHz=$10^6$ hertz, kV=kilovolts, wt %=weight percentage, GC-MS=gas chromatography-mass spectrometry, NMR=nuclear magnetic resonance.

EXAMPLE PREPARATION

Preparatory Example 1: Sodium Pentafluorophenolate

Under an atmosphere of nitrogen, aqueous 16 M sodium hydroxide (34 mL, 544 mmol) was added by addition funnel to a stirred solution of pentafluorophenol (100.1 g, 543.8 mmol) in acetonitrile (140 mL), keeping the internal temperature below 30° C. during the addition. The mixture was stirred at ambient temperature for 2 h, then concentrated by rotary evaporation to give white solid, which was further dried in a vacuum oven at 80° C. for 2 days. The yield was quantitative, 111.5 g. The structure was confirmed by $^{19}$F NMR spectroscopy.

Example 1: 1,2,3,4,5-Pentafluoro-6-[3,3,3-trifluoro-1-(1,1,2,2,2-pentafluoroethyl)-2-(trifluoromethyl)prop-1-enoxy]benzene

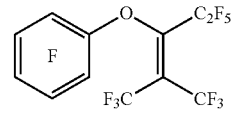

Under an atmosphere of nitrogen, perfluoro-2-(methyl)pent-2-ene (35.2 g, 117 mmol) was added by addition funnel to a stirred solution of sodium pentafluorophenolate (20.0 g, 97.1 mmol) in anhydrous acetonitrile (43 mL). When approximately a third of the addition was complete, more acetonitrile (32 mL) was added to enable smooth stirring, followed by the remaining perfluoro-2-(methyl)pent-2-ene. The mixture was heated at 45° C. for 15 h, cooled to ambient temperature, and concentrated by rotary evaporation. Upon concentration, a white solid precipitated from the fluorocarbon phase, which was removed by filtration. The crude material was purified by vacuum distillation to give >99% purity for the combined $C_{12}F_{16}O$ isomers. The structures of the $C_{12}F_{16}O$ isomers were established by GC-MS and NMR methods.

Example 2: (E)-1,2,3,4,5-Pentafluoro-6-((perfluoroprop-1-en-1-yl)oxy)benzene

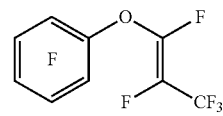

In a 600 mL steel PARR reactor, under an atmosphere of nitrogen, sodium pentafluorophenolate (200 g, 971 mmol) was combined with anhydrous acetonitrile (300 mL). The reactor was sealed, cooled in an acetone-dry ice bath and placed under vacuum. Hexafluoropropylene (217 g, 1450 mmol) was added to the cooled/evacuated reactor, in portions, over 20 min. The reactor was brought to ambient temperature, then heated to 65° C. When 65° C. was reached, the temperature was brought down to 50° C. and held for 21 h. The crude mixture was washed with 1.5 kg of 3 wt % aqueous sodium hydroxide solution to obtain a biphasic mixture. The fluoro-organic phase (bottom) was further washed twice with 500 mL of water, dried over magnesium sulfate, and filtered. The crude material was purified by vacuum distillation to give >99% purity for the combined $C_9F_{10}O$ isomers. The structures of the $C_9F_{10}O$ isomers were established by GC-MS and NMR methods. The yield was 140 g, 46%.

Example 3: (E)-1,2,3,4,5-Pentafluoro-6-((1,1,1,2,2,3,5,6,7,7,7-undecafluoro-4,6-bis(trifluoromethyl)hept-4-en-3-yl)oxy)benzene

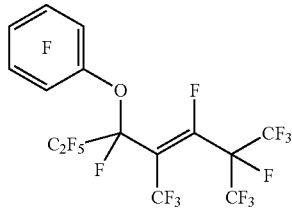

Under an atmosphere of nitrogen, (E)-perfluoro-2,4-dimethylhept-3-ene (prepared according to Makarov, K. N.; Gervits, L. L.; Cheburkov, Y. A.; Knunyants, I. L. *Journal of Fluorine Chemistry* 1977, 10, 323-327) (24.8 g, 55.1 mmol) was added by addition funnel to a stirred solution of sodium pentafluorophenolate (10.0 g, 48.6 mmol) in anhydrous acetonitrile (64 mL). The mixture was heated at 50° C., with stirring, for 15 h, then cooled to ambient temperature. The crude mixture was washed with 200 mL of water three times, dried over magnesium sulfate, and filtered. The crude material was purified by vacuum distillation to give >98% purity for the combined $C_{15}F_{22}O$ isomers. The structures of the $C_{15}F_{22}O$ isomers were established by GC-MS and NMR methods.

Example 4: (E)-((1,1,1,2,2,3,5,6,7,7,7-Undecafluoro-4,6-bis(trifluoromethyl)hept-4-en-3-yl)oxy)benzene+isomers

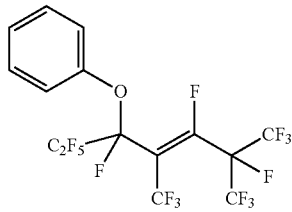

Under an atmosphere of nitrogen, triethylamine (210 g, 2080 mmol) was added dropwise by addition funnel, over 25 min, to a vigorously stirred biphasic mixture of phenol (193 g, 2050 mmol), N,N-dimethylformamide (1100 mL), and (E)-perfluoro-2,4-dimethylhept-3-ene (prepared using the procedure described above in the preparation of Example 3). The internal temperature was kept between 15 and 22° C. during the addition. The mixture was stirred at ambient temperature for 3 h. The layers were separated; the fluoro-organic layer (bottom) was washed twice with 1000 mL of 5 wt % hydrochloric acid, washed twice with 500 mL of water, dried over magnesium sulfate, and filtered. The crude material was purified by vacuum distillation to give >99% purity for the combined $C_{15}H_5F_{17}O$ isomers. The structures of the $C_{15}H_5F_{17}O$ isomers were established by GC-MS and NMR methods. The yield was 924 g, 86%.

Example 5: ((1,1,1,4,4,5,5,5-Octafluoro-2-(trifluoromethyl)pent-2-en-3-yl)oxy)benzene

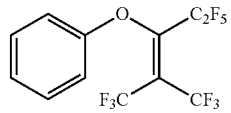

Triethylamine (103.2 g, 1020 mmol) was added dropwise via addition funnel to a vigorously stirred biphasic mixture of phenol (95.0 g, 1010 mol), N,N-dimethylformamide (254 mL) and perfluoro-2-(methyl)pent-2-ene (333.2 g, 1110 mmol). The internal temperature was kept between 0 and 25° C. during the addition. The mixture was stirred at ambient temperature for 1 h 15 min. The fluoro-organic phase (bottom) was separated, washed three times with 300 mL of water, dried over magnesium sulfate, and filtered. The crude material was purified by vacuum distillation to give >98% purity for the combined $C_{12}H_5F_{11}O$ isomers. The structures of the $C_{12}H_5F_{11}O$ isomers were established by GC-MS and NMR methods. The yield was 162 g, 43%.

Example 6: 1-((1,1,1,4,4,5,5,5-Octafluoro-2-(trifluoromethyl)pent-2-en-3-yl)oxy)-3,5-bis(trifluoromethyl)benzene

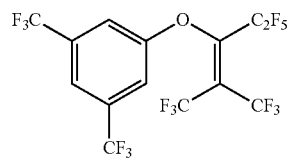

3,5-Bis(trifluoromethyl)phenol (35.0 g, 152 mmol), dissolved in acetone (50 mL), was added dropwise to a cooled, stirred suspension of perfluoro-2-(methyl)pent-2-ene (48.0 g, 160 mmol), powdered potassium carbonate (33.2 g, 240 mmol), and acetone (100 mL), over 1 h 10 min. The internal temperature was kept between 1 and 3° C. during the addition. The mixture was stirred at 0-3° C. for 10 min after the addition, then 10 min at ambient temperature, followed by filtration through silica gel. The filtrate was combined with water (300 mL) and dichloromethane (200 mL). After agitation, the layers were separated. The aqueous (top) layer was washed with 100 mL dichloromethane twice. The combined organic (bottom) layers were dried over magnesium sulfate and filtered through silica. The crude material was purified by vacuum distillation to give the isomer shown above (>98% purity). The structure was established by GC-MS and NMR methods. The yield was 45 g, 58%.

Example 7: 1-((1,1,1,4,4,5,5,5-Octafluoro-2-(trifluoromethyl)pent-2-en-3-yl)oxy)-3-(trifluoromethyl)benzene

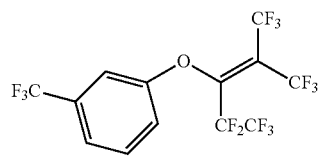

Under an atmosphere of nitrogen, perfluoro-2-(trifluoromethyl)pent-2-ene (100 g, 333 mmol) was added dropwise with vigorous stirring, over 2 h, to a cooled suspension of powdered potassium hydroxide (85%) (20.0 g, 300 mmol) in anhydrous tetrahydrofuran. The internal temperature was kept between −4 and −10° C. during the addition. 3-(Trifluoromethyl)phenol (45.2 g, 279 mmol), diluted with anhydrous tetrahydrofuran (30 mL), was added dropwise over 45 min, keeping the internal temperature between −2 and −5° C. during the addition. The mixture was brought to ambient temperature over approximately 2 h and stirred for 14 h, then filtered to remove the white solid. The volatiles were removed under vacuum. The concentrated crude product was diluted with dichloromethane (50 mL), washed with 200 mL water twice, dried over sodium sulfate, and filtered through silica gel. The crude material was purified by vacuum distillation to give the isomer shown above (>98% purity). The structure was established by GC-MS and NMR methods. The yield was 37 g, 30%.

Example 8: 1,2,3,4,5-Pentafluoro-6-(heptafluorocyclopentenyl)oxy-benzene

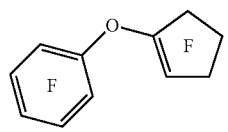

In a 600 mL steel PARR reactor, under an atmosphere of nitrogen, sodium pentafluorophenolate (52.7 g, 256 mmol) was combined with anhydrous acetonitrile (130 mL). The reactor was sealed and cooled in an ice bath. Perfluorocyclopentene (59.8 g, 282 mmol) was added and the mixture was heated, with stirring, at 50° C. for 2 days. GC-MS analysis of the crude material showed a peak consistent with 1,2,3,4,5-pentafluoro-6-(heptafluorocyclopentenyl)oxy-benzene.

Example 9:
1,3-Bis((perfluoroprop-1-en-1-yl)oxy)benzene

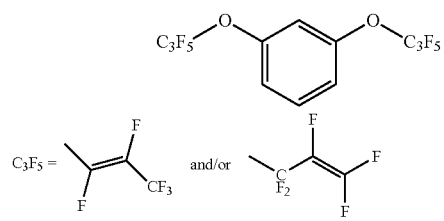

Under an atmosphere of nitrogen, a solution of 1,3-dihydroxybenzene (20.0 g, 182 mmol) in anhydrous methyl tert-butyl ether (40 mL) was added dropwise, with vigorous stirring, to a cooled suspension of sodium hydride (14.6 g, 60 wt % mineral oil dispersion, 365 mmol) in anhydrous methyl tert-butyl ether (40 mL). The internal temperature was kept between 4 and 7° C. during the addition. The hydrogen byproduct was vented through a mineral oil bubbler. The mixture was warmed to 40° C. gradually (over 30 min), causing the rate of hydrogen evolution to increase, stirred at 40° C. for 1 h 20 min, then stirred at ambient temperature for 16 h. The white suspension was transferred to a 300 mL steel PARR reactor under an atmosphere of nitrogen. The reactor was sealed, and the internal temperature was brought to −5° C. in dry ice. Hexafluoropropylene (66.5 g, 443 mmol) was added, with stirring, to the cooled reactor. The temperature was increased to 50° C. for 2 h. After cooling to ambient temperature, the crude material was filtered through diatomaceous earth, concentrated to approximately 20 mL under vacuum, washed three times with 50 mL of water, dried over magnesium sulfate, and filtered. The filtrate was distilled under vacuum to give 8.5 g of distillate. The distillate was analyzed by GC-MS: four mass fragments consistent with 1,3-bis((perfluoroprop-1-en-1-yl)oxy)benzene and its isomers (57%, combined) were observed.

Test Methods

Boiling points were determined using the procedures outlined in ASTM E 1719-97 "Standard Test Method for Vapor Pressure of Liquids by Ebulliometry." First, vapor pressure was measured, and then the boiling point was calculated as described in section 10 of ASTM method E1719-97.

Dielectric constants were measured using an Alpha-A High Temperature Broadband Dielectric Spectrometer (Novocontrol Technologies, Montabaur, Germany) in accordance with ASTM D150-11, "Standard Test Methods for AC Loss Characteristics and Permittivity (Dielectric Constant) of Solid Electrical Insulation." The parallel plate electrode configuration was selected for this measurement. The sample cell of parallel plates, an Agilent 16452A liquid test fixture consisting of 38 mm diameter parallel plates (Keysight Technologies, Santa Rosa, CA, US) was interfaced to the Alpha-A mainframe while utilizing the ZG2 Dielectric/Impedance General Purpose Interface available from Novocontrol Technologies. Each sample was prepared between parallel plate electrodes with a spacing, d, (typically, d=1 mm) and the complex permittivity (dielectric constant and loss) were evaluated from the phase sensitive measurement of the electrodes voltage difference (Vs) and current (Is). Frequency domain measurements were carried out at discrete frequencies from 0.00001 Hz to 1 MHz. Impedances from 10 milliohms up to $1 \times 10^{14}$ ohms were measured up to a maximum of 4.2 volts AC. For this experiment, however, a fixed AC voltage of 1.0 volts was used. The DC conductivity (the inverse of volume resistivity) can also be extracted from an optimized broadband dielectric relaxation fit function that contains at least one term of the low frequency Havrrilak Negami dielectric relaxation function and one separate frequency dependent conductivity term.

The liquid dielectric breakdown strength measurements were performed in accordance with ASTM D877-87(1995), "Standard Test Method for Dielectric Breakdown Voltage of Insulating Liquids." Disk electrodes 25 mm in diameter were utilized with a Phenix Technologies Model LD 60 that is specifically designed for testing in the 7-60 kV, 60 Hz (higher voltage) breakdown range. For this experiment, a frequency of 60 Hz and a ramp rate of 500 volts per second were utilized, as is typical.

Pour points were determined by placing approximately 2 mL of the sample in a 4 mL glass vial into a manually temperature-controlled bath. Pour point is defined as the lowest temperature at which, after being tilted horizontally for 5 seconds, the sample is visually observed to flow.

Density was measured using DDM 2911 plus Automatic Density Meter. Before measurement, the fluid was briefly degassed in the syringe by stoppering the syringe tip and pulling on the plunger to release bubbles.

Flash point was measured according to the procedures outlined in ASTM D-3278-96 e-1 "Standard Test Methods for Flash Point of Liquids by Small Scale Closed-Cup Apparatus." Materials that demonstrated no flash point were considered to be non-flammable according to the ASTM test method.

Values of Log Kow (octanol/water partition coefficients) were determined by HPLC using the method described in Organization for Economic Cooperation and Development (OECD) Test Method 117, "Partition Coefficient (n-octanol/water), HPLC Method."

The atmospheric lifetime of each test material was determined from relative rate studies utilizing chloromethane ($CH_3Cl$) as a reference compound. The pseudo-first order reaction rates of the reference compound and the test compound with hydroxyl radicals (OH) was determined in a laboratory chamber system. The atmospheric lifetime of the reference compound is documented in the literature. Based on this value and the pseudo-first order rates measured in the chamber experiments, the atmospheric lifetime for each specimen was calculated from the reaction rates for the test compound relative to the reference compounds and the reported lifetime of the reference compounds as shown below:

$$\tau_x = \tau_r \cdot \frac{k_r}{k_x}$$

where $t_x$ is the atmospheric lifetime of test material, $\tau_r$ is the atmospheric lifetime of the reference compound, and $k_x$ and $k_r$ are the rate constants for the reaction of hydroxyl radical with test material and the reference compound, respectively. The concentrations of gases in the test chamber were quantified by Fourier transform infrared spectroscopy (FTIR). The measured atmospheric lifetime value of each fluid was subsequently used for the GWP calculation.

Global Warming Potential (GWP) values were calculated using methods described in the Intergovernmental Panel on Climate Change (IPCC) Fifth Assessment Report (AR5). A gas standard of the material to be assessed, having a known and documented concentration, was prepared and used to obtain quantitative FTIR spectra of this compound. Quantitative gas phase, single component FTIR library reference spectra were generated at two different concentration levels by diluting the sample standard with nitrogen using mass flow controllers. The flow rates were measured using certified BIOS DRYCAL flow meters (Mesa Labs, Butler, NJ, US) at the FTIR cell exhaust. The dilution procedure was also verified using a certified ethylene calibration gas cylinder. Using methods described in AR5, the FTIR data were used to calculate the radiative efficiency, which in turn was combined with the atmospheric lifetime to calculate the GWP value.

Results

The physical properties and environmental lifetime results of the example fluorinated compounds are provided in Table 1 and are compared with commercially available perfluoropolyethers (PFPEs): Comparative Example CE1 (GALDEN HT-135, available from Solvay, Brussels, Belgium), CE2 (GALDEN HT-170, available from Solvay), and CE3 (GALDEN HT-200, available from Solvay).

All illustrative examples exhibited a boiling point of 148° C. or greater, in addition to desirable dielectric properties. All materials in the tables below were found to be non-flammable, as determined by the absence of a flash point, as defined above. Notably, the data in Table 1 illustrate the relatively low atmospheric lifetimes and low GWPs (≤0.74 and ≤49, respectively) of the fluorinated aromatic compounds of the present invention. By contrast, the comparative (PFPEs) have boiling points in the range of 135-200° C. but have GWPs of approximately 10,000.

TABLE 1

Physical Properties

| Example | MW (g/mol) | BP (° C.)* | Dielectric Constant at 1 kHz | Dielectric Strength (kV) | Pour/Freeze Point (° C.) | Density at 25° C. (g/mL) | Log Kow | Atmospheric Lifetime (yrs) | GWP (100 yrs) |
|---|---|---|---|---|---|---|---|---|---|
| 1 | 464.1 | 172 | 2.0 | — | −68 | 1.76 | 6.1 | — | — |
| 2 | 314.1 | 148 | 3.0 | — | −65 | 1.68 | 4.7 | — | — |
| 3 | 614.0 | >190 | 2.2 | — | −58 | 1.82 | >6.4 | — | — |
| 4 | 524.2 | >190 | 4.3 | 38.1 | −59 | 1.62 | >6.4 | 0.16 | 4 |
| 5 | 374.0 | 169 | 5.2 | 31.1 | −78 | 1.51 | 5.5 | — | — |
| 6 | 510.2 | 175 | 2.4 | — | — | 1.65 | — | 0.74 | 49 |
| 7 | 442.2 | 176 | 4.7 | — | −77 | 1.59 | 6.1 | — | — |
| CE1** | 610 | 135 | 1.9 | 40 | −110 | 1.72 | — | — | 10,000 |
| CE2** | 760 | 170 | 1.9 | 40 | −97 | 1.77 | — | — | 10,000 |
| CE3** | 870 | 200 | 1.9 | 40 | −85 | 1.79 | — | — | 10,000 |

*Boiling point values for Examples 1-7 have an estimated standard deviation of 5° C.
**Physical properties for CE1, CE2, and CE3 were taken from manufacturer's data sheets and GWP was taken from the Environmental Protection Agency's Mandatory Reporting of Greenhouse Gases: https://www.federalregister.gov/documents/2013/04/05/2013-07977/mandatory-reporting-of-greenhouse-gases-notice-of-data-availabilty-regarding-global-warming.

Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows. All references cited in this disclosure are herein incorporated by reference in their entirety.

What is claimed is:

1. An apparatus for heat transfer comprising:
a device; and
a mechanism for transferring heat to or from the device, the mechanism comprising a working fluid that comprises a fluorinated aromatic compound having structural formula (I):

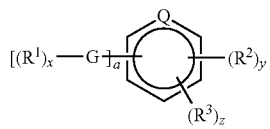
(I)

where Q is a carbon atom or a nitrogen atom;
G is an oxygen atom or a sulfur atom;
each $R^1$ is, independently, a perfluoroalkenyl group having 2 to 11 carbon atoms and optionally comprises one or more catenated heteroatoms;
each $R^2$ is, independently, (i) a hydrogen atom or a fluorine atom; or (ii) a fluoroalkyl group or a fluoroalkenyl group having 1 to 9 carbon atoms and optionally comprises one or more catenated heteroatoms;
each $R^3$ is, independently, a hydrogen atom or a fluorine atom;
x is 1-3;
a is 1-2;
y is 1-5;
when Q is a carbon atom, z=6-y-a; and
when Q is a nitrogen atom, z=5-y-a.

2. The apparatus for heat transfer of claim 1, wherein each $R^2$ is perfluorinated.

3. The apparatus for heat transfer of claim 1, wherein Q is a carbon atom.

4. The apparatus for heat transfer of claim 1, wherein each G is an oxygen atom.

5. The apparatus for heat transfer of claim 1, wherein a is 1.

6. The apparatus for heat transfer of claim 1, wherein the device is selected from a microprocessor, a semiconductor wafer used to manufacture a semiconductor device, a power control semiconductor, an electrochemical cell, a battery pack, an electrical distribution switch gear, a power transformer, a circuit board, a multi-chip module, a packaged or unpackaged semiconductor device, a fuel cell, and a laser.

7. The apparatus for heat transfer of claim 1, wherein the mechanism for transferring heat is a component in a system for maintaining a temperature or temperature range of the device.

8. A method of transferring heat comprising:
providing a device; and transferring heat to or from the device using a heat transfer fluid that comprises a fluorinated aromatic compound having structural formula (I):

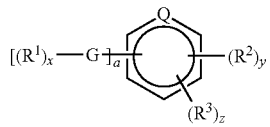
(I)

where Q is a carbon atom or a nitrogen atom;
G is an oxygen atom or a sulfur atom;
each $R^1$ is, independently, a perfluoroalkenyl group having 2 to 11 carbon atoms and optionally comprises one or more catenated heteroatoms;
each $R^2$ is, independently, (i) a hydrogen atom or a fluorine atom; or (ii) a fluoroalkyl group or a fluoroalkenyl group having 1 to 9 carbon atoms and optionally comprises one or more catenated heteroatoms;
each $R^3$ is, independently, a hydrogen atom or a fluorine atom;
x is 1-3;
a is 1-2;
y is 1-5;
when Q is a carbon atom, z=6-y-a; and
when Q is a nitrogen atom, z=5-y-a.

9. An immersion cooling system comprising:
a housing having an interior space;
a heat-generating component disposed within the interior space; and
a working fluid liquid disposed within the interior space such that the heat-generating component is in contact with the working fluid liquid;
wherein the working fluid comprises a compound having structural formula (I)

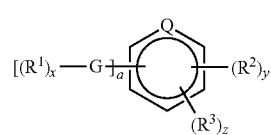
(I)

where Q is a carbon atom or a nitrogen atom;
G is an oxygen atom or a sulfur atom;
each $R^1$ is, independently, a perfluoroalkenyl group having 2 to 11 carbon atoms and optionally comprises one or more catenated heteroatoms;
each $R^2$ is, independently, (i) a hydrogen atom or a fluorine atom; or (ii) a fluoroalkyl group or a fluoroalkenyl group having 1 to 9 carbon atoms and optionally comprises one or more catenated heteroatoms;
each $R^3$ is, independently, a hydrogen atom or a fluorine atom;
x is 1-3;
a is 1-2;
y is 1-5;
when Q is a carbon atom, z=6-y-a; and
when Q is a nitrogen atom, z=5-y-a.

10. The system according to claim 9, wherein the compound is present in the working fluid at an amount of at least 25% by weight based on the total weight of the working fluid.

11. The system according to claim 9, wherein the heat-generating component comprises an electronic device.

12. The system according to claim 11, wherein the electronic device comprises a computer server.

13. A thermal management system for a lithium-ion battery pack comprising:
a lithium-ion battery pack; and
a working fluid in thermal communication with the lithium-ion battery pack;
wherein the working fluid comprises a compound having structural formula (I)

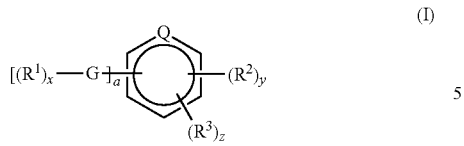

where Q is a carbon atom or a nitrogen atom;
G is an oxygen atom or a sulfur atom;
each $R^1$ is, independently, a perfluoroalkenyl group having 2 to 11 carbon atoms and optionally comprises one or more catenated heteroatoms;
each $R^2$ is, independently, (i) a hydrogen atom or a fluorine atom; or (ii) a fluoroalkyl group or a fluoroalkenyl group having 1 to 9 carbon atoms and optionally comprises one or more catenated heteroatoms;
each $R^3$ is, independently, a hydrogen atom or a fluorine atom;
x is 1-3;
a is 1-2;
y is 1-5;
when Q is a carbon atom, z=6-y-a; and
when Q is a nitrogen atom, z=5-y-a.

* * * * *